US007776684B2

(12) United States Patent
Doyle et al.

(10) Patent No.: US 7,776,684 B2
(45) Date of Patent: Aug. 17, 2010

(54) INCREASING THE SURFACE AREA OF A MEMORY CELL CAPACITOR

(75) Inventors: Brian S. Doyle, Portland, OR (US); Robert S. Chau, Beaverton, OR (US); Vivek De, Beaverton, OR (US); Suman Datta, Beaverton, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 11/731,193

(22) Filed: Mar. 30, 2007

(65) Prior Publication Data

US 2008/0237796 A1 Oct. 2, 2008

(51) Int. Cl.
*H01L 21/8242* (2006.01)
(52) U.S. Cl. ............... 438/253; 438/238; 438/239; 438/396; 438/284; 257/E21.014
(58) Field of Classification Search ............... 438/253, 438/238, 239, 396, 284; 257/E21.014
See application file for complete search history.

(56) References Cited

U.S. PATENT DOCUMENTS 5,552,334 A * 9/1996 Tseng ............... 438/254
6,420,229 B2 * 7/2002 Tsuboi ............... 438/253
6,472,266 B1 * 10/2002 Yu et al. ............... 438/241
2008/0237675 A1 * 10/2008 Doyle et al. ............... 257/303

* cited by examiner

*Primary Examiner*—Matthew Smith
*Assistant Examiner*—John M Parker
(74) *Attorney, Agent, or Firm*—Blakely, Sokoloff, Taylor & Zafman LLP

(57) ABSTRACT

Methods and apparatuses to increase a surface area of a memory cell capacitor are described. An opening in a second insulating layer deposited over a first insulating layer on a substrate is formed. The substrate has a fin. A first insulating layer is deposited over the substrate adjacent to the fin. The opening in the second insulating layer is formed over the fin. A first conducting layer is deposited over the second insulating layer and the fin. A third insulating layer is deposited on the first conducting layer. A second conducting layer is deposited on the third insulating layer. The second conducting layer fills the opening. The second conducting layer is to provide an interconnect to an upper metal layer. Portions of the second conducting layer, third insulating layer, and the first conducting layer are removed from a top surface of the second insulating layer.

8 Claims, 11 Drawing Sheets

INCREASING THE SURFACE AREA OF A MEMORY CELL CAPACITOR

FIELD

Embodiments of the invention relate to the field of microelectronic device manufacturing; and more specifically, to fabrication of memory cell capacitors.

BACKGROUND

Today's computer chips are increasingly dependent on robust memory architecture capable of quickly accessing and handling large amounts of data. Existing memory solutions such as off-chip physical dynamic random access memory (DRAM) that sit on the mother board separate from the computer chip require relatively large amounts of energy and suffer from high latency, resulting in power-performance loss. Latency problems have been addressed using 1T-1C Dynamic Random Access Memory ("DRAM") cells that have a transistor and a capacitor that are embedded on the computer chip. Existing versions of such DRAM cells, however, are frequently unable to meet ever-increasing capacitance demands.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

In the following description, numerous specific details, for example, specific materials, structures, dimensions of the elements, processes, etc. are set forth in order to provide thorough understanding of one or more embodiments of the present invention. It will be apparent, however, to one of ordinary skill in the art that the one or more embodiments of the present invention may be practiced without these specific details. In other instances, microelectronic device fabrication processes, techniques, materials, equipment, etc., have not been described in great details to avoid unnecessarily obscuring of this description. Those of ordinary skill in the art, with the included description, will be able to implement appropriate functionality without undue experimentation.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Methods and apparatuses to increase the surface area of a memory cell capacitor are described. An opening in a second insulating layer deposited over a first insulating layer on a substrate is formed. The substrate has a fin. A first insulating layer is deposited over the substrate adjacent to the fin. The opening in the second insulating layer is formed over the fin. A first conducting layer is deposited over the second insulating layer and the fin. Next, a third insulating layer is deposited on the first conducting layer. Further, a second conducting layer is deposited on the third insulating layer. The second conducting layer fills the opening. The second conducting layer is to provide an interconnect to an upper metal layer. Portions of the second conducting layer, third insulating layer, and the first conducting layer are removed from a top surface of the second insulating layer.

Figure 1A:
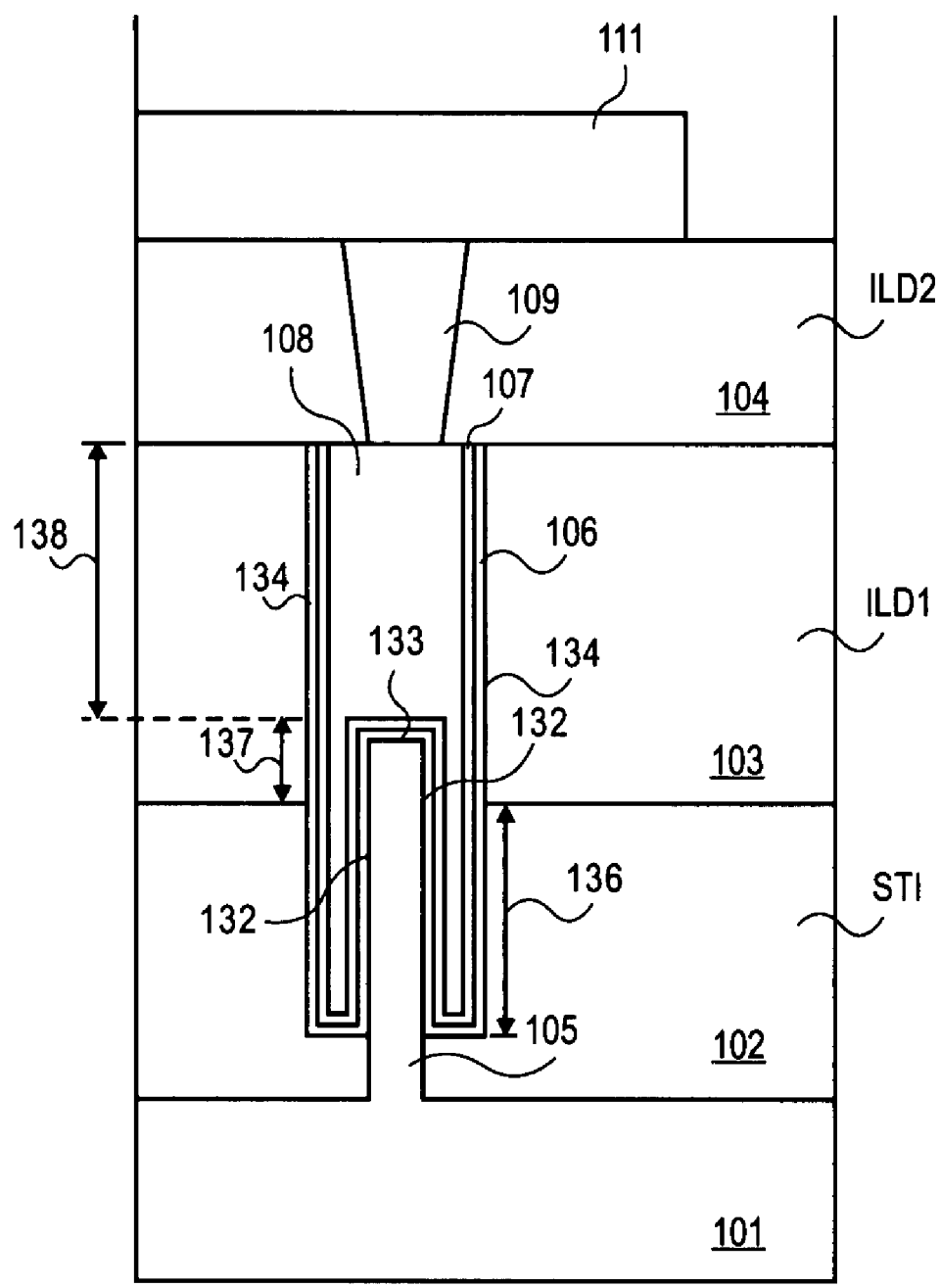
FIG. 1A shows a cross-sectional view of one embodiment of a wafer having an increased area capacitor for a memory cell.

FIG. 1A shows a cross-sectional view of one embodiment of a wafer having an increased area capacitor for a memory cell. As shown in FIG. 1A, wafer 100 includes a substrate 101 having a semiconductor fin 105, an electrically insulating layer 102 over substrate 101 adjacent to fin 105, and an electrically insulating layer 103 over insulating layer 102. In one embodiment, substrate 101 having fin 105 includes a monocrystalline silicon ("Si"), germanium ("Ge"), silicon germanium ("SiGe"), a III-V material such as gallium arsenide ("GaAs"), or any combination thereof. In one embodiment, wafer 100 includes one or more metallization layers, such as a conducting layer 111, of integrated circuits having active and passive devices, e.g., transistors, switches, optoelectronic devices, capacitors, resistors, and interconnects. The one or more metallization layers of integrated circuits are separated from adjacent metallization layers by dielectric material, e.g., interlayer dielectric ("ILD"). The adjacent metallization layers may be electrically interconnected by vias, such as a via 109.

In one embodiment, electrically insulating layer 102 is an oxide layer, e.g., silicon dioxide. In one embodiment, insulating layer 102 is a shallow trench isolation ("STI") layer to provide field isolation regions that isolate one device, for example a capacitor, from another device, for example a transistor (not shown) on substrate 101. In one embodiment, the thickness of the STI layer 102 is in the approximate range of 1,000 angstroms ("Å") to 5,000 Å. Shallow trench isolation layers are known to one of ordinary skill in the art of microelectronic device manufacturing. As shown in FIG. 1A, fin 105 protrudes from a top surface of substrate 101 into insulating layer 102. In one embodiment, fin 105 has a height that may be defined as a distance from the interface between substrate 101 and insulating layer 102 and to a top surface 133 of fin 105. In one embodiment, the height of fin 105 is between about 1,000 Å to about 5,000 Å. In one embodiment, fin 105 is a semiconductor material that is degenerately doped. In another embodiment, semiconductor fin 105 is made electrically conducting through silicidation, or the like. As shown in FIG. 1A, wafer 100 comprises an electrically insulating layer 103 formed on insulating layer 102. In one embodiment, insulating layer 103 is an interlayer dielectric ("ILD1"), e.g., silicon dioxide. In another embodiment, insulating layer 103 may include polyimide, epoxy, photodefinable materials, such as benzocyclobutene ("BCB"), and WPR-series materials, or glass. In one embodiment, insulating layer 103 is a low permittivity ("low-k") ILD layer. Typically, "low-k" is referred to the dielectrics having dielectric constant ("permittivity k") lower than the permittivity of silicon dioxide. In one embodiment, the thickness of the IlD1 layer 103 is in the approximate range of 5,000 Å-10,000 Å.

As shown in FIG. 1A, electrically conducting layer 106 is formed over electrically insulating layer 103 and over fin 105. As shown in FIG. 1A, conducting layer 106 is deposited on opposite sidewalls 134 of the opening in insulating layer 103, upper portions 132 of opposing sidewalls and top surface 133 of fin 105. In one embodiment, the material of electrically conducting layer 106 is a metal having a work function that lies approximately mid-way between a conductive band and a valence band of the oxide or other electrically insulating material of electrically insulating layer 102. A material having a work function as described may be used to control leakage of the capacitor. As an example, the metal of conducting layer 106 can be titanium nitride ("TiN"), tantalum nitride ("TaN"), any other like material, or any combination thereof. In another embodiment, conducting layer 106 includes an electrically conductive semiconductor material. In yet another embodiment, conducting layer 106 includes a metal, e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

As shown in FIG. 1A, an electrically insulating layer 107 is formed on electrically conducting layer 106. In one embodiment, electrically insulating layer 107 is a high-k dielectric. Next, as shown in FIG. 1A, an electrically conducting layer 108 is deposited onto electrically insulating layer 107. As shown in FIG. 1A, a fin capacitor includes a thin conducting layer 106, an insulating layer 107, and a thick conducting layer 108. In one embodiment, the fin capacitor is a tri-gate storage capacitor with the three gates located at the three interfaces between fin 105 and an adjacent portion of electrically conducting layer 106. Such fin capacitor may be used along with a tri-gate transistor (not shown) as part of a 1T-1C DRAM cell. In another embodiment, the fin capacitor having fin 105 is a decoupling capacitor.

In one embodiment, insulating layer 107 is a high-k dielectric material having a dielectric constant ("permittivity"κ) greater than the dielectric constant of silicon dioxide. The dielectric constant of silicon dioxide is about 3.9. The insulating layer 107 is a high-k dielectric material that is chosen to be compatible with wafer processing techniques and temperatures. In one embodiment, insulating layer 107 is a high-k material that is chosen such that charge leakage of the capacitor is minimized. In one embodiment, electrically insulating layer 107 comprises a high-k dielectric material that has the dielectric constant between about 5 to about 40. For example, insulating layer 107 can be zirconium oxide ("$ZrO_2$"), hafnium oxide ("$HFO_2$"), lanthanum oxide ("$La_2O_4$"), and the like, including combinations and/or laminates thereof. In another embodiment, insulating layer 107 is lead zirconium titanate ("PZT"), which may have dielectric constant greater than 100.

As shown in FIG. 1A, a thick electrically conducting layer 108 is deposited on insulating layer 107. In one embodiment, electrically conducting layer 108 comprises an electrically conducting material that is substantially the same as the electrically conducting material making up electrically conducting layer 106. In another embodiment, electrically conducting layer 108 comprises an electrically conducting material that is different from the electrically conducting material making up electrically conducting layer 106. Using different electrically conducting materials may be desirable when, for example, processing issues dictate that one of the electrically conducting materials be more etchable than the other electrically conducting material.

As shown in FIG. 1A, conducting layer 108 is connected through conductive via 109 with an upper conducting layer 111. As shown in FIG. 1A, conductive via 109 is formed in insulating layer 104 that is deposited above insulating layer 103. Conductive vias are known to one of ordinary skill in the art of microelectronic device manufacturing. As shown in FIG. 1A, conducting layer 111 is formed on insulating layer 104. In one embodiment, insulating layer 104 is an interlayer dielectric layer ("ILD2").

As shown in FIG. 1A, a fin capacitor that includes conducting layer 106, insulating layer 107, and conducting layer 108 has an increased capacitance area that follows a length of electrically insulating layer 107. As shown in FIG. 1A, the capacitance area is increased by extending a portion of the capacitor above fin 105 through insulating layer 103 to upper insulating layer 104. In one embodiment, the portion of capacitor from top surface 133 of fin 105 to upper insulating layer 104 that is extended to the upper interconnect system has length 138 that is about equal to the length 136 of the portion of the capacitor that extends into lower insulating layer 102. In one embodiment, the top surface 133 of fin 105 protrudes into insulating layer 103 to a distance 137 of about 10% of the height of the fin 105. In one embodiment, each of lengths 138 and 136 is in the approximate range of 2,000 Å to 5,000 Å. As result, a capacitance area can be enhanced by at least a factor of two over that of a capacitor in which the metal-insulator-metal ("MIM") stack is confined to the immediate region around fin 105. The increased capacitance area provides an increased stored charge resulting in improved performance of the memory cell capacitor.

Figure 1B:
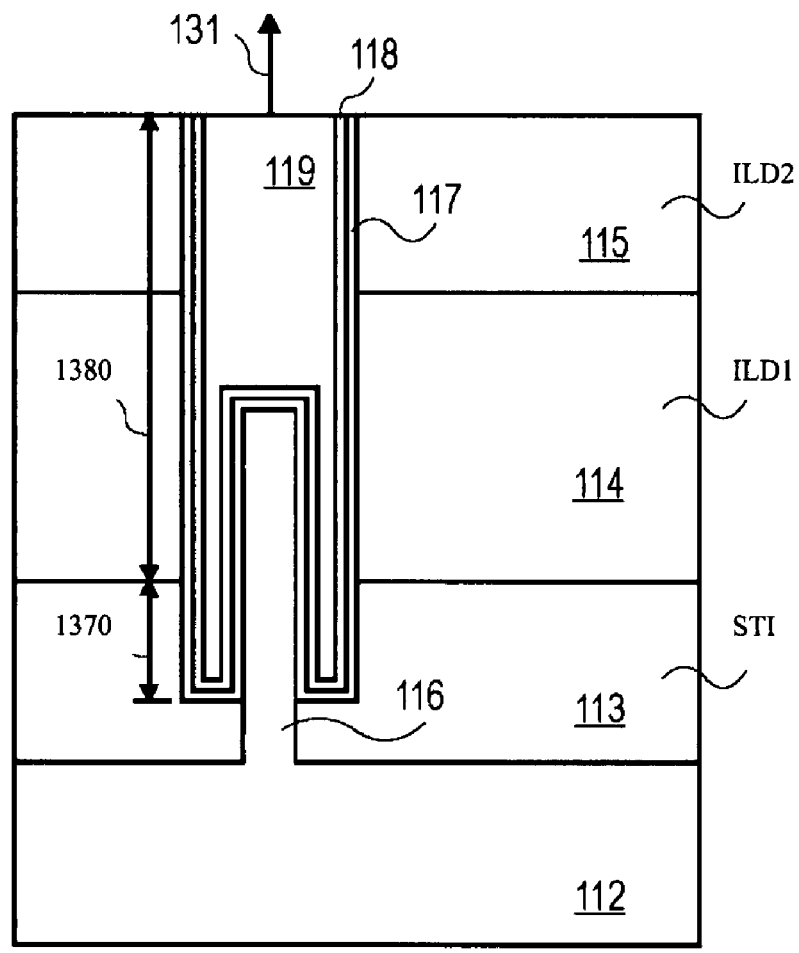
FIG. 1B shows a cross-sectional view of another embodiment of a wafer having an increased area capacitor for a memory cell.

FIG. 1B shows a cross-sectional view of another embodiment of a wafer 110 having an increased area capacitor for a memory cell. As shown in FIG. 1B, wafer 110 includes a substrate 112 having a semiconductor fin 116, an electrically insulating layer 113 over substrate 112 adjacent to fin 116, an electrically insulating layer 114 over insulating layer 113, as described above with respect to FIG. 1A. As shown in FIG. 1B, electrically insulating layer 115 is deposited on insulating layer 114. In one embodiment, insulating layers 115 and 114 have one or more metallization layers (not shown) of integrated circuits having active and passive devices, for example, one or more Metal 1 layers. In one embodiment, insulating layer 115 is an interlayer dielectric ("ILD2"), e.g., silicon dioxide. In another embodiment, insulating layer 115 may include polyimide, epoxy, photodefinable materials, such as benzocyclobutene ("BCB"), and WPR-series materials, or glass. In one embodiment, insulating layer 115 is a low permittivity ("low-k") ILD layer. In one embodiment, insulating layer 115 has substantially the same insulating material, as insulating layer 114. In one embodiment, insulating layers 114 and 115 are formed over insulating layer 113 as one insulating layer. In another embodiment, insulating materials of layers 115 and 114 are different.

As shown in FIG. 1B, an electrically conducting layer 117 is formed on portions of electrically insulating layers 113, 114, 115, and on fin 116. An electrically insulating layer 118 is formed on electrically conducting layer 117, as described above with respect to FIG. 1A. As shown in FIG. 1B, an electrically conducting layer 119 is deposited onto electrically insulating layer 118, as described above with respect to FIG. 1A. As shown in FIG. 1B, a fin capacitor includes thin conducting layer 117, insulating layer 118, and thick conducting layer 119, as described above with respect to FIG. 1A.

A fin capacitor of wafer 110 that includes conducting layer 117, insulating layer 118, and conducting layer 119 has a capacitance area that follows a length of electrically insulating layer 118. As shown in FIG. 1B, the capacitance area of the fin capacitor of wafer 110 is greater than the capacitance area of the fin capacitor depicted in FIG. 1A. The capacitance area is increased by extending a portion of the capacitor 131 above fin 116 further through two insulating layers 114 and 115 to upper conducting layer (not shown), e.g., a Metal 1 layer and/or Metal 2 layer. In one embodiment, the capacitance area of fin capacitor of wafer 110 is increased by extending the capacitor through two upper insulating layers while keeping the height of the fin 116 intact. In one embodiment, the length 1380 of the portion of the capacitor from the interface between insulating layer 113 and insulating layer 114 that extends into upper insulating layers 114 and 115 is greater than the length 1370 of the portion of the capacitor that extends down into lower insulating layer 113. In one embodiment, length 1380 is at least about 2,000 Å and length 1370 is less than 2,000 Å.

Figure 1C:
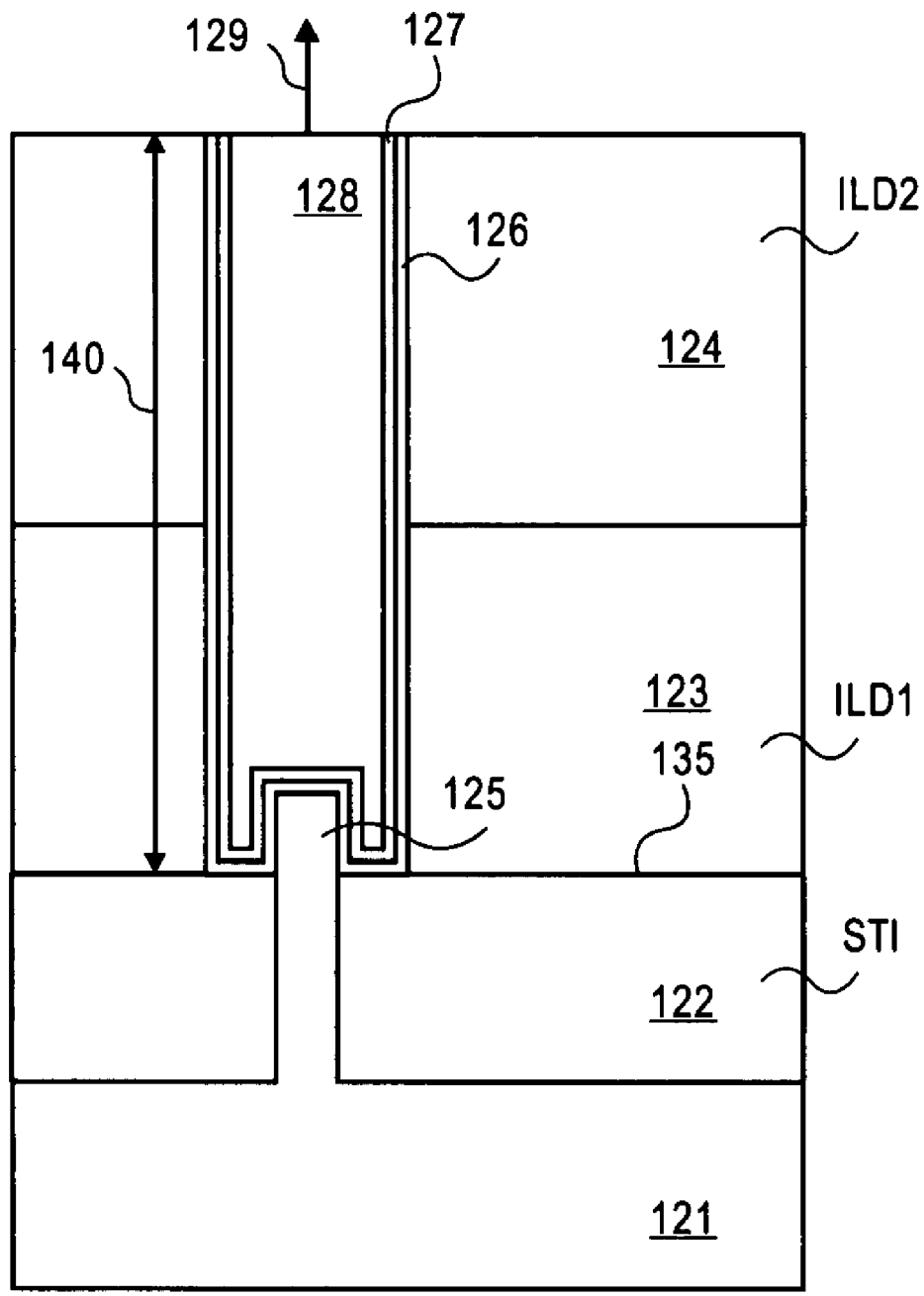
FIG. 1C shows a cross-sectional view of another embodiment of a wafer having an increased area capacitor for a memory cell.

FIG. 1C shows a cross-sectional view of another embodiment of a wafer 120 having an increased area capacitor for a memory cell. As shown in FIG. 1C, wafer 120 includes a substrate 121 having a semiconductor fin 125, an electrically insulating layer 122 over substrate 121 adjacent to fin 125, an electrically insulating layer 123 over insulating layer 122, as described above with respect to FIG. 1A. As shown in FIG. 1C, electrically insulating layer 124 is deposited on insulating layer 123, as described above with respect to FIG. 1B. In one embodiment, insulating layer 124 has one or more metallization layers (not shown) of integrated circuits having active and passive devices, for example, one or more Metal 1 and Metal 2 layers. In one embodiment, insulating layer 124 is an interlayer dielectric ("ILD2"), e.g., silicon dioxide. In another embodiment, insulating layer 124 may include polyimide, epoxy, photodefinable materials, such as benzocyclobutene ("BCB"), and WPR-series materials, or glass. In one embodiment, insulating layer 124 is a low permittivity ("low-k") ILD layer. In one embodiment, insulating layer 124 has substantially the same insulating material, as insulating layer 123. In one embodiment, insulating layers 123 and 124 are formed over insulating layer 113 as one insulating layer. In another embodiment, insulating materials of layers 124 and 123 are different.

As shown in FIG. 1C electrically conducting layer 126 is formed on portions of electrically insulating layers 123, 124, and on upper portions of fin 125 that protrude into insulating layer 123. Conducting layer 126 is formed on interface 135 between insulating layer 122 and 123, as shown in FIG. 1C. As shown in FIG. 1C, electrically conducting layer 126 is not formed on lower portions of fin located below interface 135. An electrically insulating layer 127 is formed on electrically conducting layer 126, as described above with respect to FIG. 1A. As shown in FIG. 1C, an electrically conducting layer 128 is deposited onto electrically insulating layer 127, as described above with respect to FIG. 1A. As shown in FIG. 1C, a fin capacitor includes thin conducting layer 126, insulating layer 127, and thick conducting layer 128, as described above with respect to FIG. 1A.

A fin capacitor of wafer 120 that includes conducting layer 126, insulating layer 127, and conducting layer 128 has a capacitance area that follows a length of electrically insulating layer 127. As shown in FIG. 1C, the capacitance area of the fin capacitor of wafer 120 is increased by extending a portion of capacitor 129 above fin 125 further into upper interconnect system insulating layers, to connect to one or more upper metal layers (not shown), e.g., a Metal 3 layer. As such, the capacitance area of fin capacitor of wafer 120 is increased by extending the capacitor through two upper insulating layers instead of extending the capacitor down into insulating layer 122.

In one embodiment, the length 140 of the portion of the capacitor from the interface 135 between insulating layer 122 and insulating layer 123 that extends into upper insulating layers 123 and 124 provides the increased capacitance area. As shown in FIG. 1C, the capacitor does not extend into lower insulating layer 122. In one embodiment, length 140 is at least 2,000 Å.

As shown in FIGS. 1A-1C, the capacitance area of the memory cell capacitor can be increased by, for example, extending the capacitor through upper insulating layers above the capacitor fin into interconnect system, by extending the capacitor down through the lower insulating layer, such as STI layer that is adjacent to the capacitor fin, and both.

Figure 2A:
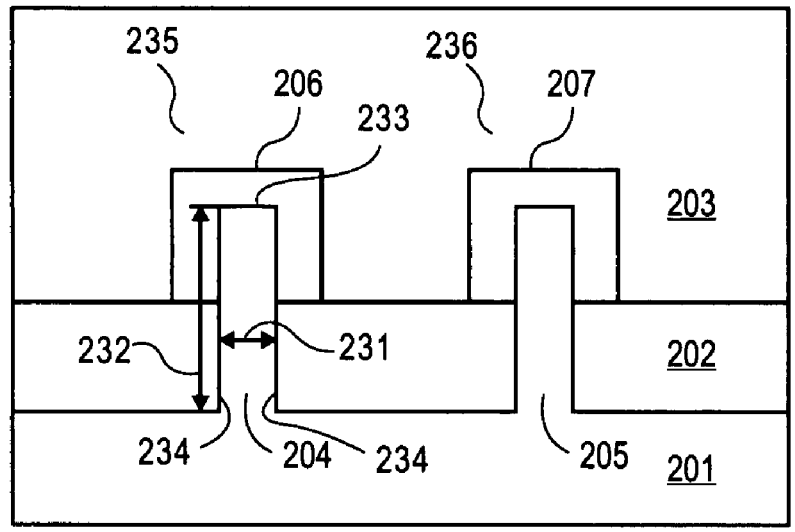
FIG. 2A is a cross-sectional view of one embodiment of a wafer to form a fin memory cell having a fin capacitor with an increased capacitance area.

FIG. 2A is a cross-sectional view of one embodiment of a wafer 200 to form a fin memory cell having a fin capacitor with an increased capacitance area. As illustrated in FIG. 2A, wafer 200 includes a substrate 201, and an electrically insulating layer 202 deposited over substrate 201. As shown in FIG. 2A, substrate 201 includes a fin 204 of a tri-gate capacitor 235 and a fin 205 of a tri-gate transistor 236. Fin 204 and fin 205 protrude from the top surface of substrate 201 into insulating layer 202, such that insulating layer 202 is adjacent to fin 204 and fin 205, as shown in FIG. 2A. Each of fins 204 and 205 has opposing sidewalls, such as sidewalls 231 and a top surface, such as top surface 233, as shown in FIG. 2A. Tri-gate transistor 236 may be an access transistor, or a logic transistor. In one embodiment, substrate 201 having fins 204 and 205 includes a monocrystalline silicon (Si), germanium (Ge), silicon germanium (SiGe), a III-V material such as gallium arsenide (GaAs), or any combination thereof.

As an example, substrate 201, insulating layer 202, and fin 204 can be similar to, respectively, substrate 101, electrically insulating layer 102, and fin 105 shown in FIG. 1A. In one embodiment, semiconductor fin 205 includes a substantially the same material as semiconductor fin 204. An electrically conducting layer 206 is deposited on fin 204 and an electrically conducting layer 207 is deposited on fin 205, as shown in FIG. 2A. In one embodiment, electrically conducting layers 206 and 207 are polysilicon layers. In one embodiment, the thickness of each of the conducting layers 206 and 207 is in the approximate range of 400 Å-1500 Å. In one embodiment, conducting layer 206 of polysilicon is deposited on Removable Metal Gate ("RMG") 1C fin 204 of a memory cell capacitor. An insulating layer 203 is deposited on insulating layer 202 covering conducting layers 206 and 207. In one embodiment, insulating layer 203 is an ILD layer, and insulating layer 202 is a STI layer. In one embodiment, ILD layer 203 has the thickness in the approximate range of 1,000 Å to 10,000 Å. In one embodiment, STI layer 202 has the thickness in the approximate range of 1,000 Å-10,000 Å. Fin 204 and fin 205 are at least partially surrounded by an ILD 203. As an example, ILD 203 can be similar to ILD 103, shown in FIG. 1A. As shown in FIG. 2A, fin 204 has width 231 and height 232. In one embodiment, the width of fin 204 is in the approximate range of 30 Å-300 Å and the height is in the approximate range of 1,000 Å-10,000 Å. In one embodiment, the widths and the heights of fins 204 and 205 may be substantially the same.

Figure 2B:
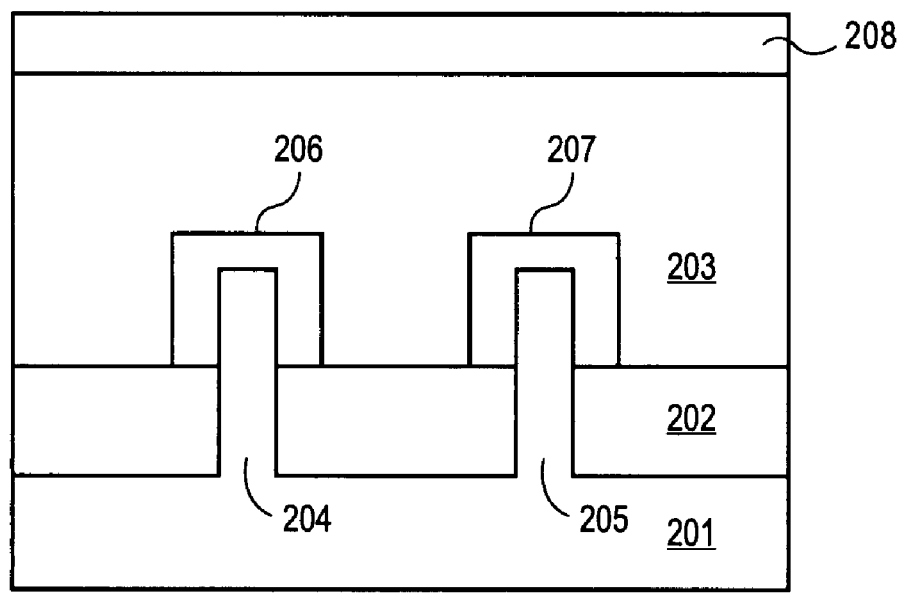
FIG. 2B is a view similar to FIG. 2A, after a hard mask layer is deposited on top of a second insulating layer according to one embodiment of the invention.

FIG. 2B is a view similar to FIG. 2A, after a hard mask layer 208 is deposited on top of a second insulating layer 203 according to one embodiment of the invention. Hard mask layer 208 may be made of any material that prevents the underlying materials from unnecessary etching. In one embodiment, hard mask layer 208 is an oxide. In another embodiment, hard mask layer 208 is a nitride. In yet another embodiment, hard mask layer 208 is a silicon carbide. In one embodiment, hard mask layer 208 of nitride is deposited on top of the low-k ILD layer 203. Hard mask layer 208 may have the thickness in the approximate range of 100 Å-500 Å. Hard mask layer 208 may be deposited on insulating layer 203 using one of the techniques known to one of ordinary skill in the art of microelectronic device manufacturing, for example, a CVD, physical vapor deposition ("PVD"), or sputtering technique.

Figure 2C:
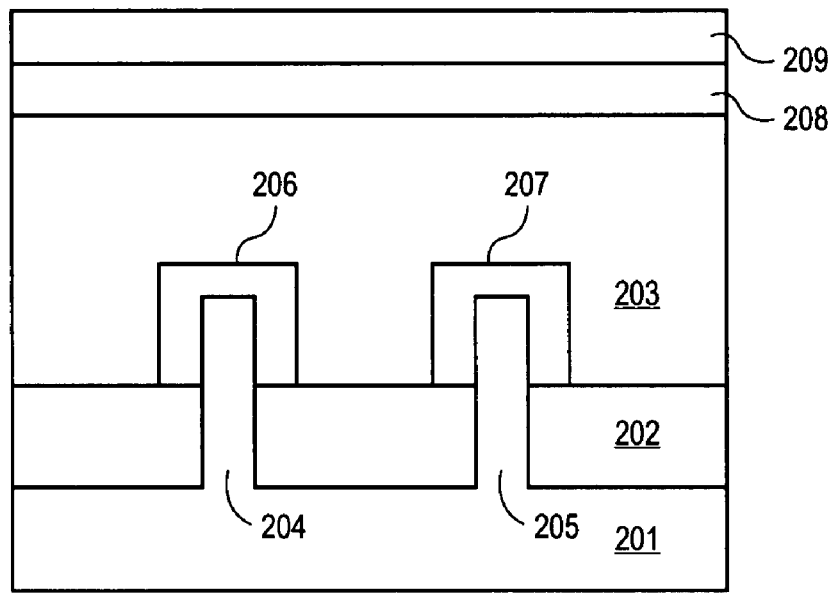
FIG. 2C is a view similar to FIG. 2B, after a photoresist layer is deposited on a hard mask layer according to one embodiment of the invention.

FIG. 2C is a view similar to FIG. 2B, after a photoresist layer 209 is deposited on hard mask layer 208 according to one embodiment of the invention. Photoresist layer 209 is deposited to define an opening in hard mask layer 208. The purpose of hard mask layer 208 is to protect specific regions of wafer 200 covered by hard mask 208 from unnecessary etching. In one embodiment, hard mask layer 208 is used to protect fin 205 of tri-gate transistor that is covered by conducting layer 207, from etching. Photoresist 209 can be deposited using one of techniques known to one of ordinary skill in the art of microelectronic device manufacturing, e.g., using a spinning-on technique.

Figure 2D:
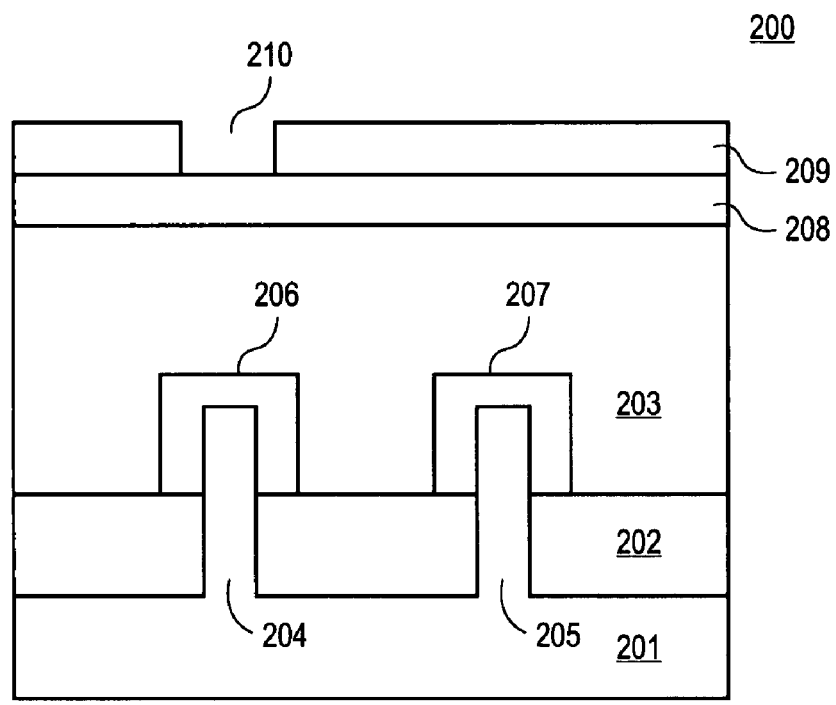
FIG. 2D is a view similar to FIG. 2C, after the photoresist layer is patterned and etched according to one embodiment of the invention

As shown in FIG. 2D, photoresist 209 is patterned and etched to form an opening to expose a portion of hard mask 208 above fin 204. Photoresist 209 may be patterned using one of photolithographic techniques known in the art. Depositing, patterning and etching of the photoresist are known to one of ordinary skill in the art of microelectronic device manufacturing. In one embodiment, the width 210 of the opening in photoresist 209 determines the width of the opening in ILD layer 203 formed later on in the process. In one embodiment, the width 210 of the opening is in the approximate range of 300 Å to 3000 Å.

Figure 2E:
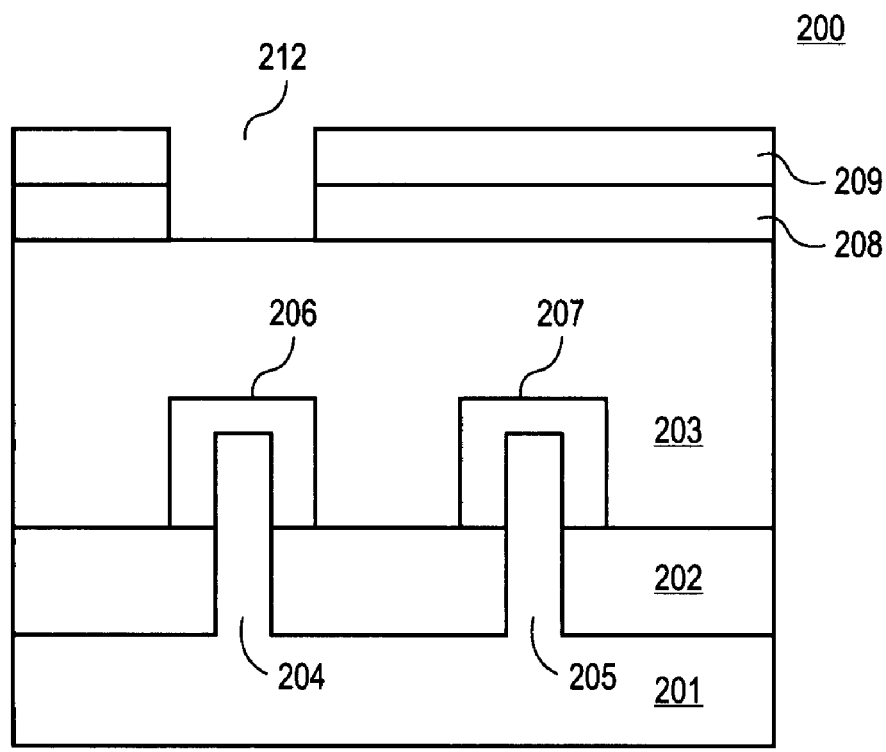
FIG. 2E is a view similar to FIG. 2D, after an opening in the hard mask layer is formed according to one embodiment of the invention.

FIG. 2E is a view similar to FIG. 2D, after an opening 212 in hard mask layer 208 is formed according to one embodiment of the invention. In one embodiment, the portion of hard mask layer 208 that have been exposed by photoresist 209 is removed to expose a portion of insulating layer 203 over fin 204, as shown in FIG. 2E. Further, the exposed portion of the hard mask layer 208 that is located over fin 204 is removed using etching, for example, by dry etching. Dry etching may be performed using one of techniques known to one of ordinary skill in the art of microelectronic device manufacturing, for example, a reactive ion etching (RIE) technique.

Figure 2F:
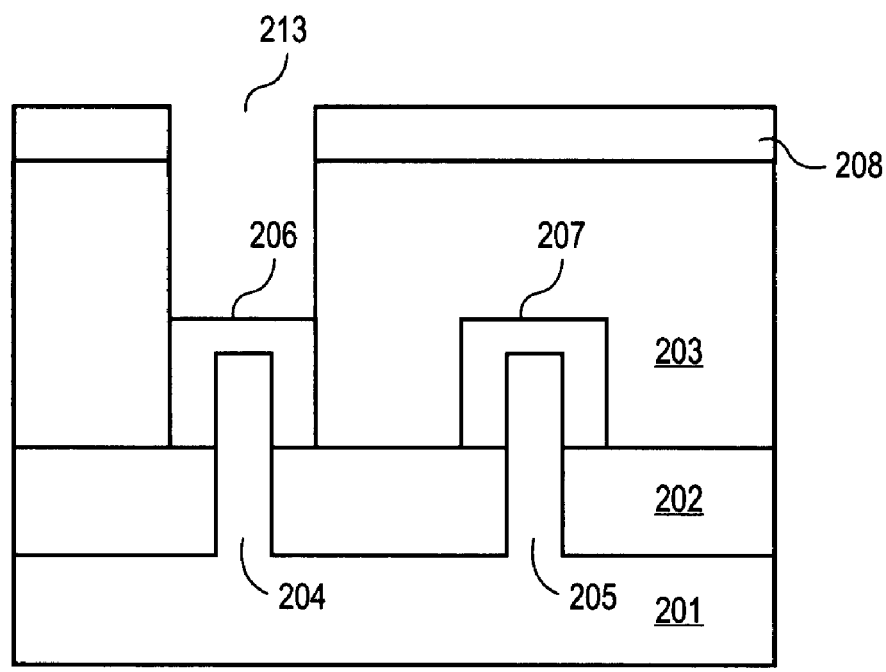
FIG. 2F is a view similar to FIG. 2E, after an opening in the second insulating layer is formed according to one embodiment of the invention.

FIG. 2F is a view similar to FIG. 2E, after an opening in second insulating layer 203 is formed according to one embodiment of the invention. As shown in FIG. 2F, photoresist 209 is removed. Photoresist 209 may be removed using one of techniques known to one of ordinary skill in the art of microelectronic device manufacturing, for example, photoresist 209 may be stripped away from hard mask layer 208. As shown in FIG. 2F, the exposed portion of insulating layer 203 over fin 204 is removed. In one embodiment, insulating layer 203 of ILD oxide is dry etched down to conducting layer 206 of polysilicon.

Figure 2G:
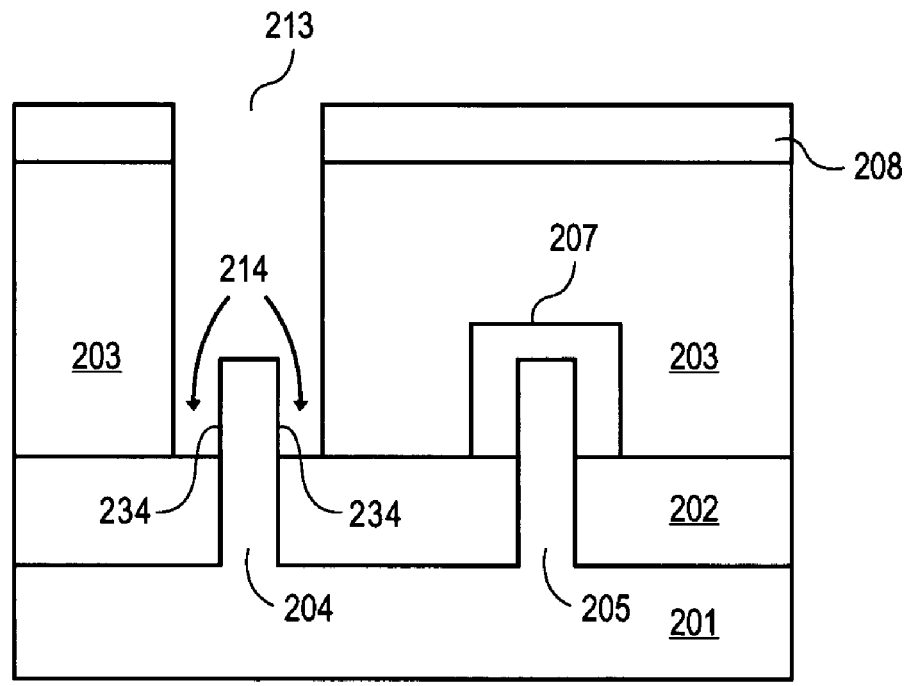
FIG. 2G is a view similar to FIG. 2F, after a third conducting layer is removed according to one embodiment of the invention.

FIG. 2G is a view similar to FIG. 2F, after a third conducting layer 206 is removed to expose portions 214 of insulating layer 202 according to one embodiment of the invention. In one embodiment, conducting layer 206 of polysilicon is removed from RMG fin 204 of a memory cell capacitor to form opening 213 having portions 214. As shown in FIG. 2G, portions 214 of insulating layer 202 are exposed between insulating layer 203 and opposing sidewalls 234 of fin 204. In one embodiment, conducting layer 206 is removed by etching. For example, conducting layer 206 of polysilicon can be wet etched, using ammonium hydroxide, tetramethylammonium hydroxide ("TMAH"), and the like etching solutions. In one embodiment, the width of the opening 213 is in the approximate range 300 A-3000 A. In one embodiment, only electrically conducting layer 207 is deposited on fin 205, and electrically conductive layer 206 is not deposited on fin 204. In this embodiment, the wet etch to remove conductive layer 206 of polysilicon is not needed, so that a dry etch of the insulating ILD layer 203 is performed. In another embodiment, conductive layer 206 depicted in FIG. 2A is not present, so that insulating layer 203 directly surrounds fin 204. In this embodiment opening 213 is formed by removing insulating layer 203 of ILD 1 from the top surface and sidewalls 234 of fin 204 using dry etching. In one embodiment, each of the portions 214 has the width in the approximate range of 150 Å-1500 Å.

Figure 2H:
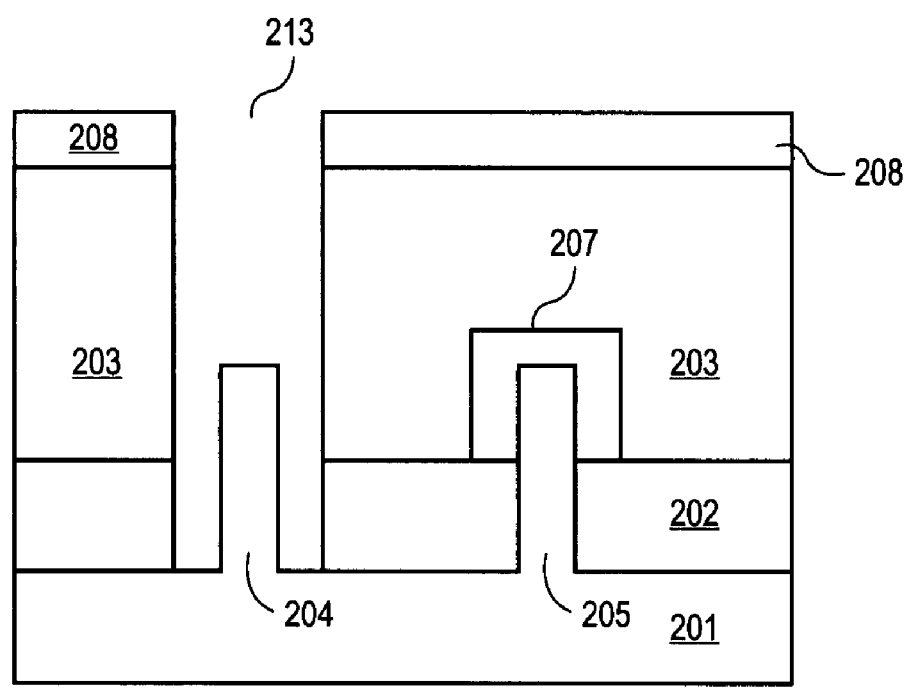
FIG. 2H is a view similar to FIG. 2G, after portions of the first insulating layer are etched down according to one embodiment of the invention.

FIG. 2H is a view similar to FIG. 2G, after portions 214 are etched down into insulating layer 202 through opening 213 to increase the exposed area of the fin 204. In one embodiment, insulating layer 202 of oxide is etched down to substrate 201. In one embodiment, STI insulating layer 202 is etched down to substrate 201 using one of dry etching techniques, for example, an RIE technique.

Figure 2I:
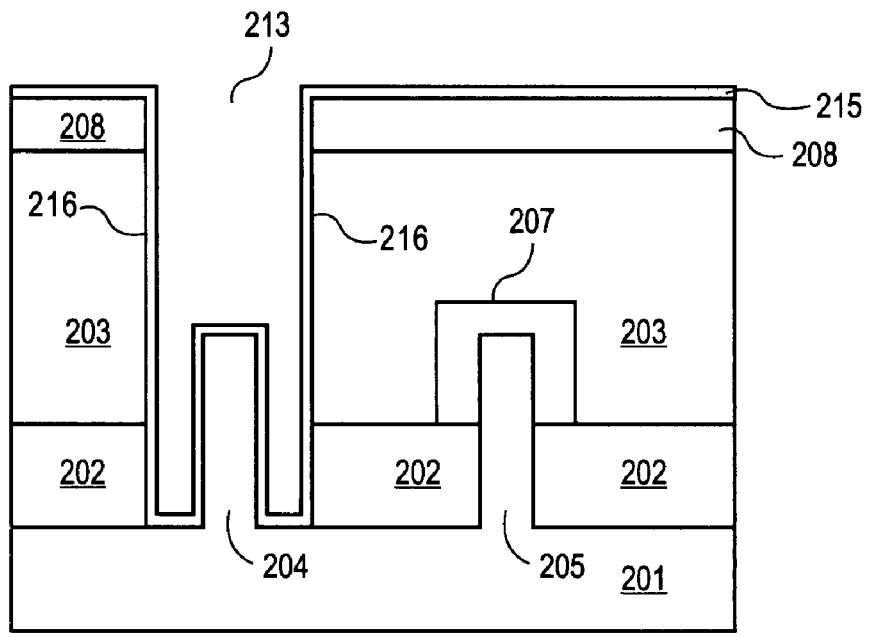
FIG. 2I is a view similar to FIG. 2H, after a thin conducting layer is deposited over the second insulating layer and fin according to one embodiment of the invention.

FIG. 2I is a view similar to FIG. 2H, after a thin conducting layer 215 is deposited over insulating layer 203 and fin 204. As shown in FIG. 2I, thin conducting layer 215 is deposited onto hard mask layer 208, sidewalls 216 of insulating layer 203, sidewalls and a top surface of fin 204, side portions of insulating layer 202 facing fin 204, and onto portions of substrate 201 between fin 204 and insulating layer 202. In one embodiment, conducting layer 215 provides ohmic contact with semiconductor fin 204, and acts as a bottom electrode of a Fin tri-gate memory cell 1C capacitor.

In one embodiment, conducting layer 215 is a metal layer. In one embodiment, conducting layer 215 of a metal is substantially the same as described above electrically conducting layer 106 shown in FIG. 1A. In one embodiment, conducting layer 215 of a metal is deposited onto ILD insulating layer 203, fin 204, STI insulating layer 202, and hard mask 208 using an electroless deposition, a chemical vapor deposition (CVD) or CVD-like process, an atomic layer deposition (ALD), and the like. In one embodiment, conductive layer 215 comprises a metal having a work function that lies approximately mid-way between a conductive band and a valence band of an electrically insulating material that makes up the electrically insulating layer 203. In one embodiment, conducting layer 215 has the thickness in the approximate range of 10 Å-200 Å.

Figure 2J:
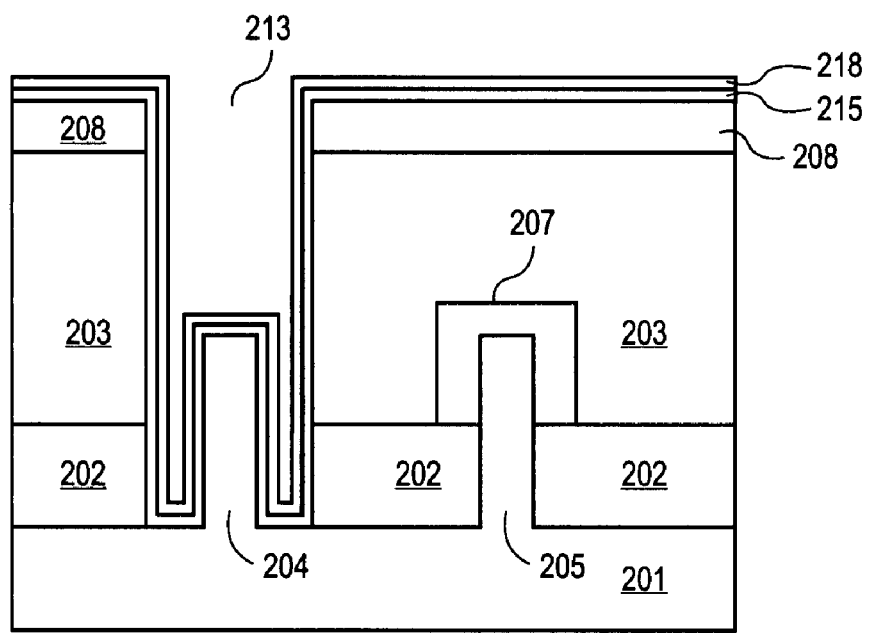
FIG. 2J is a view similar to FIG. 2I, after a third insulating layer is deposited on the thin conductive layer according to one embodiment of the invention.

FIG. 2J is a view similar to FIG. 2I, after a third electrically insulating layer 218 is deposited on conductive layer 215. In one embodiment, electrically insulating layer 218 is substantially the same as electrically insulating layer 107 shown in FIG. 1A. In one embodiment, insulating layer 218 is a high-k dielectric, as described above with respect to FIGS. 1A-1C. In one embodiment, insulating layer 218 of high-k dielectric is deposited on layer 215 using an Atomic Layer Deposition ("ALD") technique. In another embodiment, insulating layer 218 is deposited using a chemical vapor deposition ("CVD") technique. In one embodiment, insulating layer 218 is deposited to the thickness in the approximate range of 10 Å-200 Å.

Figure 2K:
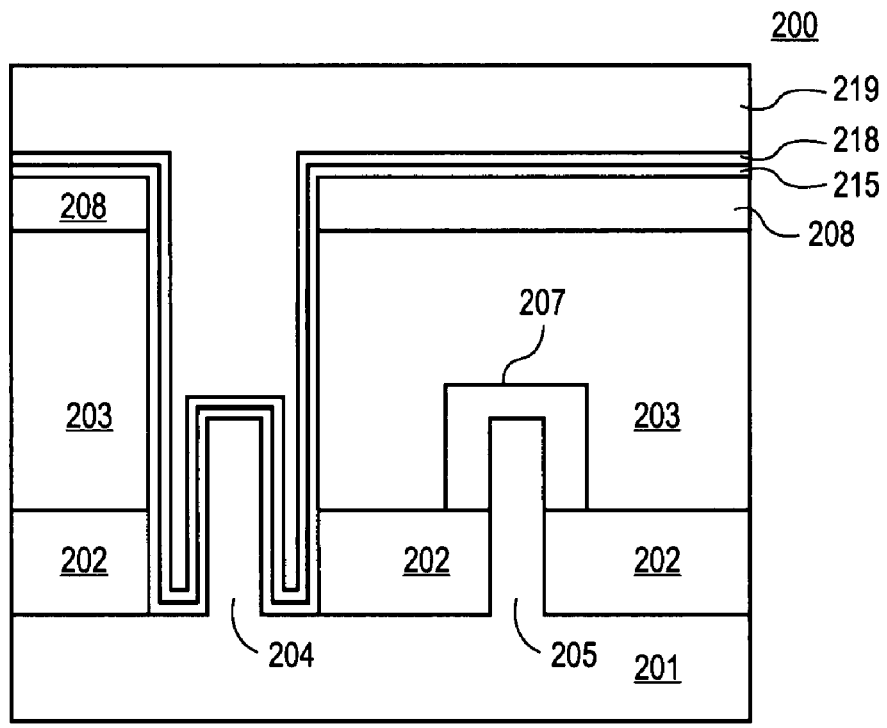
FIG. 2K is a view similar to FIG. 2J, after a thick conductive layer is deposited on the third insulating layer according to one embodiment of the invention.

FIG. 2K is a view similar to FIG. 2J, after a thick conductive layer 219 is deposited on insulating layer 218 according to one embodiment of the invention. In one embodiment, conductive layer 219 is a metal layer that acts as a top electrode of the Fin tri-gate 1C capacitor of the memory cell. As shown in FIG. 2K, conductive layer 219 is deposited to the thickness such that opening 213 is filled with conductive layer. In one embodiment, conductive layer 219 is substantially the same as conducting layer 108 described above with respect to FIG. 1A. In one embodiment, conductive layers 219 and 215 are metal layers that are made of the same material. In another embodiment, the metal making up metal layer 219 is different from the metal making up metal layer 215. Conducting layer 215 can be deposited onto insulating layer 218 using, for example, an electroless deposition, a chemical vapor deposition (CVD) or CVD-like process, an atomic layer deposition (ALD), and the like.

Figure 2L:
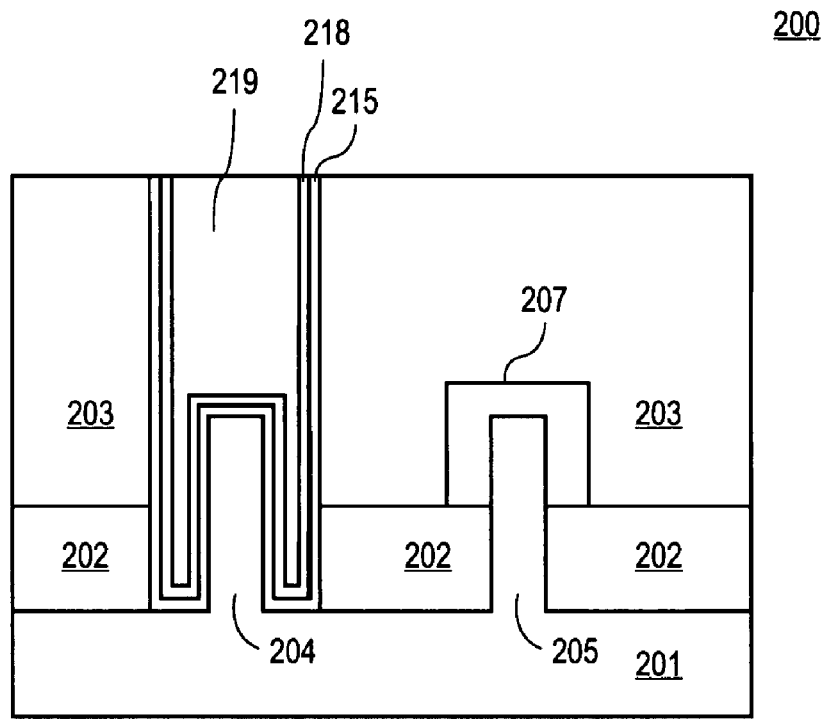
FIG. 2L is a view similar to FIG. 2K, after portions of the thick conductive layer, third insulating layer, thin conductive layer, and hard mask layer are removed from the top surface of the second insulating layer according to one embodiment of the invention.

FIG. 2L is a view similar to FIG. 2K, after portions of thick conductive layer 219, third insulating layer 218, thin conductive layer 215, and hard mask layer 208 are removed from the top surface of second insulating layer 203 according to one embodiment of the invention. In one embodiment, conductive layer 219, insulating layer 218, conductive layer 215, and hard mask layer 208 are polished off from the top surface of insulating layer 203. In another embodiment, conductive layer 219, insulating layer 218, and conductive layer 215, are polished off from hard mask layer 208, and hard mask layer 208 is removed by wet etching. Conducting layer 218 fills opening 213 in insulating layer 203 to provide an interconnect to an upper metal layer, as described above with respect to FIG. 1A and 1B.

Figure 3:
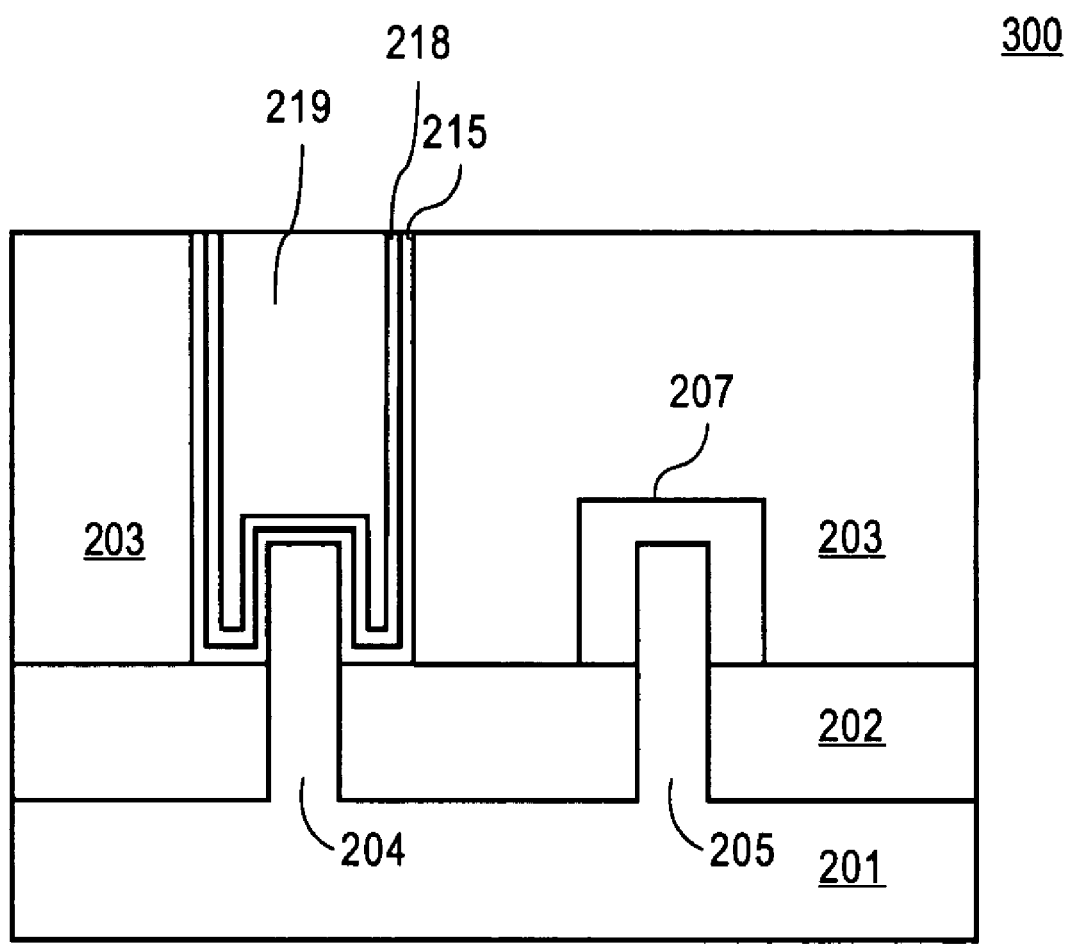
FIG. 3 is a view similar to FIG. 2G, after a thin conducting layer is deposited on sidewalls of the second insulating layer and on a portion of the fin, according to another embodiment of the invention.

FIG. 3 is a view similar to FIG. 2G, after thin conducting layer 215 is deposited on sidewalls of insulating layer 203 and on the portion of fin 204 that protrudes above the interface between insulating layer 202 and 203, according to another embodiment of the invention. As shown in FIG. 3, insulating layer 202 has not been etched down to substrate, so that the portions of fin 304 adjacent to insulating layer 202 are not exposed. Conducting layer 215 is deposited onto the sidewalls of insulating layer 203 that face fin 204, on the interface between insulating layers 202 and 203, and on the top surface and opposing sidewalls of fin 204, as shown in FIG. 3.

As shown in FIG. 3, insulating layer 218 is deposited onto thin conducting layer 215, as described above with respect to FIGS. 2J and 2L. Thick conducting layer 219 is deposited onto insulating layer 218, as described above with respect to FIGS. 2K and 2L. Conducting layer 218 fills the opening in insulating layer 203 to provide an interconnect to an upper metal layer, as described above with respect to FIG. 1C.

Figure 4:
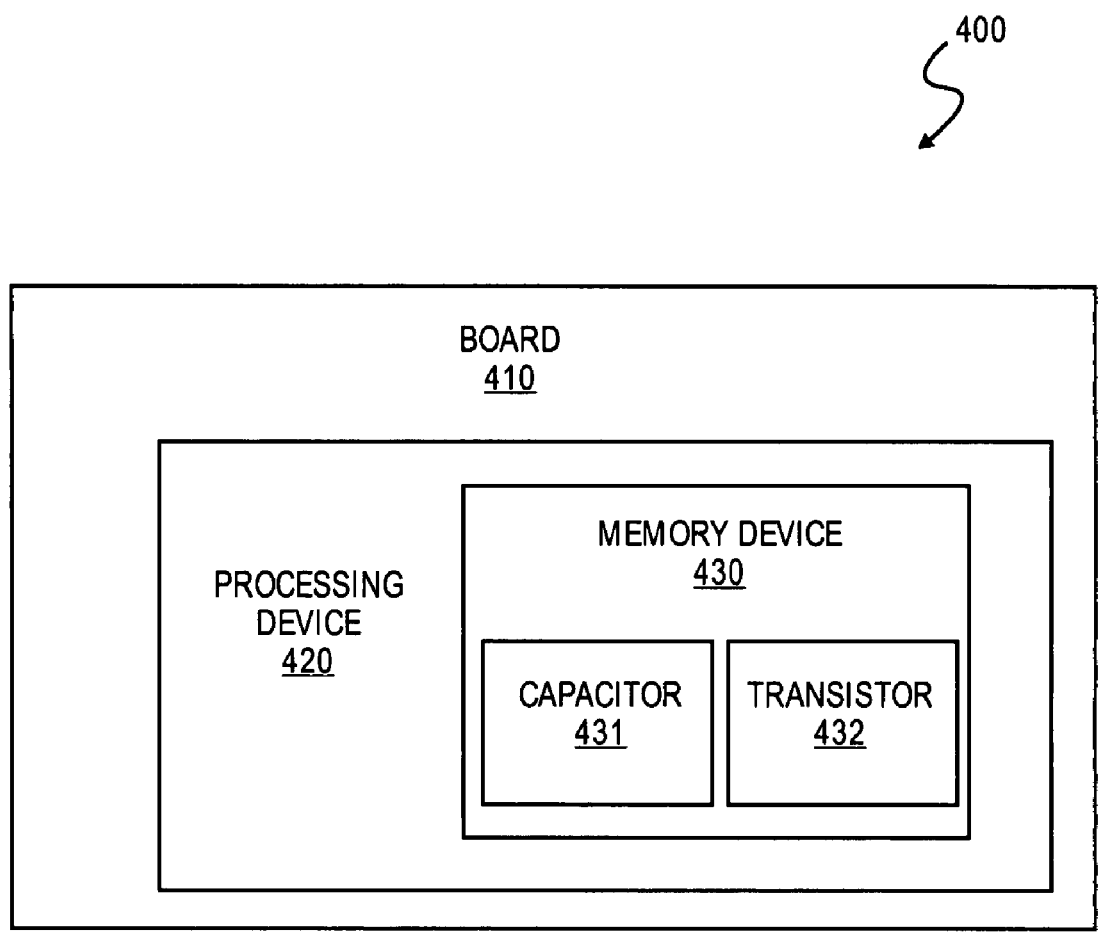
FIG. 4 is a schematic representation of a system including a capacitor according to an embodiment of the invention.

FIG. 4 is a schematic representation of a system 400 including a capacitor according to an embodiment of the invention. As illustrated in FIG. 4, system 400 comprises a board 410, a processing device 420 disposed on board 410, and a memory device 430 disposed on and coupled to processing device 420. Memory device 430 comprises a Fin capacitor 431 having the increased surface area, as described with respect to FIGS. 1A-1C, 2A-2L, and 3. As shown in FIG. 4, memory device 430 further comprises a Fin transistor 432, as described above with respect to FIGS. 2A-2L, and 3. In one embodiment, memory device 430 is a dynamic random access memory cell.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to increase a surface area of a memory cell capacitor, comprising:
    forming a first opening in a second insulating layer deposited over a first insulating layer on a substrate having a fin, wherein the first opening is formed over the fin;
    depositing a first conducting layer over the second insulating layer and over the fin;
    depositing a third insulating layer on the first conducting layer;
    depositing a second conducting layer on the third insulating layer;
    depositing a hard mask layer on the second insulating layer; and
    forming a second opening in the hard mask layer to expose the second insulating layer over the fin.

2. A method as in claim 1, wherein the forming the first opening includes dry etching the second insulating layer.

3. The method of claim 1, further comprising
    removing a portion of the first insulating layer adjacent to the fin to form a trench.

4. The method of claim 1, wherein the third insulating layer is a high-k dielectric.

5. A method as in claim 1, wherein the second insulating layer includes an interlayer dielectric.

6. The method of claim 1, wherein at least a portion of the fin is covered by a polysilicon layer, and wherein the method further comprises
    removing the polysilicon layer from the fin.

7. A method to increase a surface area of a memory cell capacitor, comprising:
    forming a first opening in a second insulating layer deposited over a first insulating layer on a substrate having a fin, wherein the first opening is formed over the fin;
    depositing a first conducting layer over the second insulating layer and over the fin;

depositing a third insulating layer on the first conducting layer;

depositing a second conducting layer on the third insulating layer; and removing portions of the second conducting layer, third insulating layer, and the first conducting layer from a top surface of the second insulating layer.

8. A method to increase a surface area of a memory cell capacitor, comprising:

forming a first opening in a second insulating layer deposited over a first insulating layer on a substrate having a fin, wherein the first opening is formed over the fin;

depositing a first conducting layer over the second insulating layer and over the fin;

depositing a third insulating layer on the first conducting layer;

depositing a second conducting layer on the third insulating layer, wherein the depositing the second conducting layer includes filling the first opening with the second conducting layer.

* * * * *